United States Patent [19]
Freed
[11] 3,882,422
[45] May 6, 1975

[54] LC AND CRYSTAL TRANSISTOR OSCILLATORS

[76] Inventor: Karol Freed, 1424 N. Walnut, Arlington Heights, Ill. 60004

[22] Filed: May 6, 1974

[21] Appl. No.: 467,261

[52] U.S. Cl. .......... 331/116 R; 331/117 R; 331/173
[51] Int. Cl. .......................... H03b 5/12; H03b 5/36
[58] Field of Search ............ 331/116 R, 117 R, 158, 331/160, 167, 169, 173

[56] References Cited

OTHER PUBLICATIONS

Jordan, The Electronic Engineer, February 1968, pp. 56–59.

*Primary Examiner*—Siegfried H. Grimm
*Attorney, Agent, or Firm*—Dominik, Knechtel, Godula & Demeur

[57] ABSTRACT

The embodiment of the invention disclosed herein is directed primarily to structural improvements in oscillator circuits which can be used in the field of power conversion. The oscillator circuit is provided with inductive and capacitive reactance means and a coupling capacitor connecting the circuit point between the reactance elements to the base electrode of a solid state amplifier element such as a transistor. The function of the coupling capacitor within the structural combination disclosed is to provide a coupling to the base electrode of the transistor and to substantially isolate the tuned circuit from other circuit parameters, such as the output load, from materially affecting the frequency of oscillation and the relative amplitude thereof. Of particular interest with regard to the oscillator circuit disclosed herein is the use of a pair of transistors to provide a high power output oscillator circuit with minimum loading or frequency shift of the oscillator circuit.

10 Claims, 13 Drawing Figures

LC AND CRYSTAL TRANSISTOR OSCILLATORS

BACKGROUND OF THE INVENTION

This invention relates generally to improvements in the structure and apparatus used in the field of power conversion, and more particularly to an oscillator circuit and its combination of elements that provide substantial useful improvements over existing oscillator circuits which are now commonly used in the field of power conversion. However, it will be understood that while this invention is directed particularly to oscillator circuits used for power conversion, the specific devices disclosed herein can be used in other allied fields such as local oscillators for radio receivers or audio and RF oscillators, and the like.

Heretofore, oscillator circuits used in the field of power conversion and other allied fields have been relatively expensive and complicated to manufacture and/or operate over relatively long periods of time with repeated reliability. To generate AC power with a transistor amplifier, a portion of the output power must be returned to the input of the amplifier in phase so that it forms a regenerative or positive feedback with the initial power applied to the transistor. The power delivered to the load, therefore, is equal to the output power of the transistor minus the feedback power.

In addition to the requirement for regenerative feedback, frequency determining elements such as inductance, capacitance, and/or crystals, are required in addition to the necessary DC bias voltage applied to the transistor electrodes. The frequency determining circuit frequently includes an inductance-capacitance network, a crystal, or a resistance-capacitance network. Transistor oscillator circuits that use these types of circuit networks are well-known in the art. However, the most basic type of circuit presently utilized is relatively unstable in frequency and varies substantially with variations in external circuit parameters such as applied voltage and the like. Bias voltage requirements for transistor oscillators are similar to those for transistor amplifier circuits but further include accurately controlled feedback circuits which are often complicated and expensive.

For example, in the well-known common-base configuration of a transistor oscillator, the input impedance is relatively low while the output impedance is relatively high. Coupling the feedback signal from the output to the input requires a feedback network which is also an impedance matching network to match the unequal impedances. Furthermore, the loss due to the mismatch made by compensating for the mismatch in impedance absorbs much of the feedback energy, so also absorbing much of the total oscillator circuit energy.

Other transistor configurations for an oscillator circuit are determined by the oscillator requirements and the advantages of a particular transistor amplifier configuration. For example, a common-base configuration has the lowest input impedance and the highest output impedance and compensation for the loss in feedback must be made with an impedance matching circuit. Current gain for the transistor is, therefore, less than one, while the voltage and power gains are greater than one. Furthermore, no phase reversal exists between the input and output terminals.

With regard to a common-emitter transistor configuration, the input and output impedances are moderate, thus reducing the requirement for impedance matching within the feedback circuit. The common-emitter configuration closely resembles the grounded cathode electron tube circuit well known in the art. However, in this circuit configuration a phase reversal occurs between the input and output circuits, and, therefore, accurate phase control of the feedback signal must be acquired.

The common-collector transistor configuration has a relatively high input impedance and a moderate output impedance which again requires an impedance matching network between the input and output circuits. Therefore, all of the common types of oscillator transistor circuit configurations listed above have inherent disadvantages which require substantial circuit configuration to obtain reliable operation.

SUMMARY OF THE INVENTION

Accordingly, it is an object of this invention to provide a new and improved oscillator circuit which is relatively simple and inexpensive in construction while maintaining a high degree of reliability and efficiency in operation.

Another object of this invention is to provide a new and improved oscillator circuit which provides the necessary feedback circuit through a feedback network which has the value thereof selected to substantially completely eliminate the necessity of additional electronic components for impedance matching.

Another object of this invention is to provide a new and improved oscillator circuit which can be used to develop high power output signals from the oscillator output without substantially loading the oscillator.

Many other objects, features and advantages of this invention will be more fully realized and understood from the following detailed description when taken in conjunction with the accompanying drawings wherein like reference numerals throughout the various views of the drawings are intended to designate similar elements or components.

DETAILED DESCRIPTION OF THE ILLUSTRATED EMBODIMENTS

Figure 1:
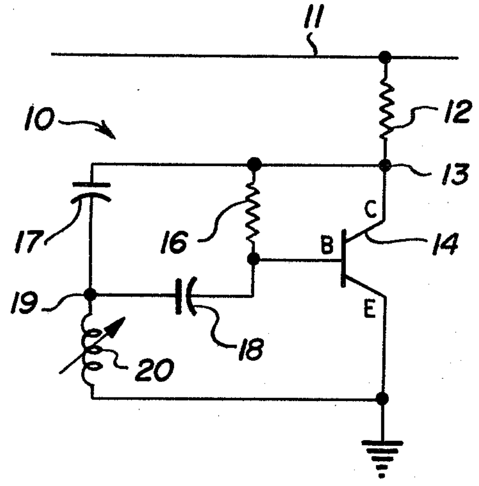
FIG. 1 is a schematic diagram of one specific circuit configuration of an oscillator constructed in accordance with the principles of this invention.

Referring now to FIG. 1 there is seen an oscillator circuit constructed in accordance with the principles of this invention and designated generally by reference numeral 10. The oscillator 10 receives operating voltage over a line 11 and through a series load resistor 12. In the illustrated embodiment, the voltage is applied to line 11 and to a terminal point 13 which is connected to the collector electrode of a transistor 14. The voltage at terminal point 13 is also applied to the base electrode of transistor 14 through a biasing resistor 16 which, in turn, has the ends thereof connected to a pair of split capacitors 17 and 18. Connected to a terminal point 19, between capacitors 17 and 18, is a variable inductance element 20 which constitutes the inductive reactance for the oscillator circuit. The variable inductance element 20 together with the series connected capacitor 17 form the substantial part of the resonant circuit while capacitor 18 functions primarily as a triggering capacitor to stimulate the base electrode of transistor 14 for operation.

The frequency of the circuit arrangement of FIG. 1 can be tuned by changing the values of the inductance element 20 or by paralleling the inductance element with a capacitor. The oscillator circuit 10, furthermore, will operate over a wide range of applied voltages to line 11.

When the inductance element 20 of FIG. 1 is selected to be in the order of about 5 milihenries and is paralleled with a 470 picofarad capacitor, the operating frequency of the oscillator 10 will be about 100 KHz. When the 5 milihenry inductance element 20 is connected as shown in the FIGURE in series with capacitor 17, the operating frequency will be about 170 KHz. The output waveform from terminal point 13 is a very close approximation of a sine wave with the peak-to-peak amplitude substantially equal to the applied voltage at line 11. The circuit arrangement illustrated in FIG. 1 is quite stable in operation and changing the transistor type from, for example, 2N3707 to type SE4002 produces negligable frequency or operating changes.

The operating characteristics of the circuit arrangement require only that the inductive element 20 support oscillations. The value of the collector resistor 12 is not critical in the circuit arrangement illustrated but the ratio of the resistor 12 to the resistor 16 determines the class of operation of the oscillator. Accordingly, the collector resistor can be be increased so that the collector current is reduced to about 50 microamps while still maintaining oscillations.

Figure 2:
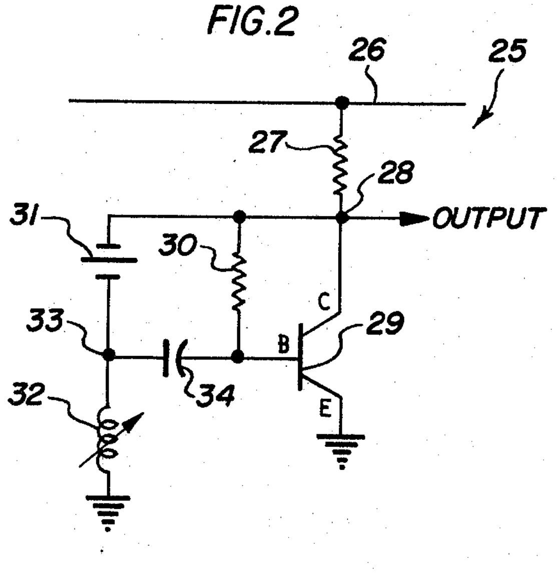
FIG. 2 is an alternate embodiment of the oscillator circuit of FIG. 1 and incorporates the use of a crystal in conjunction with the tuned circuit thereof.

Referring now to FIG. 2 there is seen an alternate embodiment of an oscillator circuit constructed in accordance with the principles of this invention and which is designated generally by reference numeral 25. The oscillator circuit 25 receives operating voltage over a line 26 which is connected to a series resistor 27. Resistor 27 is connected to a circuit point 28 which, in turn, applies operating voltage to the collector electrode of a transistor 29 and applies a bias potential to the base electrode of the transistor through a resistor 30.

In this alternate configuration of the oscillator circuit, a resonant crystal element 31 is connected in series with a variable inductance element 32. A circuit point 33 between the inductance element 32 and crystal 31 is coupled to the base electrode of transistor 29 through a capacitor 34 to provide a proper phase and amplitude signal necessary to sustain oscillations.

The value of coupling capacitor 34 is selected to obtain a sine wave oscillation output signal at terminal 28. Furthermore, the value of the inductance element 32 is adjusted for locking the crystal 31 to the proper frequency of oscillation. The output amplitude obtained at terminal point 28 is approximately the applied voltage and this circuit configuration has the ability of being connected to a low resistance output load.

Also, the modified circuit configuration of FIG. 2 has an output amplitude which is constant over a broad frequency range when in the free running mode, i.e. when crystal 31 is replaced with a capacitor. With the crystal 31 in the circuit, operating frequency is substantially constant over a broad voltage range applied to the circuit. The circuit configuration of FIG. 2 is capable of operating reliably at frequencies greater than 200 KHz at low distortion of the sine wave output signal.

Figure 3:
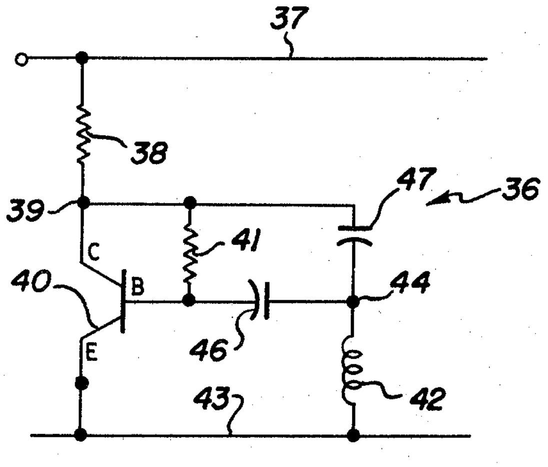
FIG. 3 is an alternate circuit configuration of the oscillator of this invention and utilizes a fixed value inductance element in the tuned circuit thereof.

Referring now to FIG. 3 there is seen another alternate configuration of an oscillator circuit constructed in accordance with the principles of this invention and which is designated generally by reference numeral 36. Here operating voltage is applied to the oscillator circuit 36 over a line 37. The operating potential at line 37 is coupled to the oscillator circuit 36 through a collector load resistor 38, the value of which may correspond to the value of the corresponding resistors in FIGS. 1 and 2. The operating potential is applied to the output terminal 39 and therefrom to the collector electrode of a transistor 40. Bias potential is applied to transistor 40 through a resistor 41.

In this illustrated embodiment, a fixed value inductance element 42 has one end thereof connected to a common line 43 and the other end thereof connected to a circuit point 44 intermediate a pair of capacitors 44 and 47. Capacitor 47 cooperates with inductance element 42 to provide the substantial portion of the capacitive reactance necessary for oscillations of the oscillator. Capacitor 46, however, provides the appropriate amplitude and phase signal to sustain oscillations.

In the circuit arrangement of FIG. 3 the static parameters are obtained by considering the values only of transistor 40 and resistors 38 and 41. The voltage at terminal 39 is established by the voltage drop across resistor 38 which, in turn, is somewhat determined by the bias potential applied to the base electrode of transistor 40 as determined by the value of resistor 41.

The operating characteristics of the circuit are such that when the power is applied to line 37, terminal point 39 will have a potential decrease which is determined by the value of bias resistor 41. This potential decrease charges capacitor 47 which, in turn, discharges into the inductance element 42. The inductance element 42 provides a storage of electrical energy at an exponential rate towards a maximum value at which point the magnetic field collapses. The voltage generated across the inductance element is substantially sinusoidal and the period of oscillation is determined by the inductance, capacitance and resistance in the circuit. Transistor 40 operates as a grounded base amplifier for a majority of the operating cycle. The current generated by the charging and discharging of the inductance element 42 flows through the emitter electrode circuit connection and develops a voltage across the series load resistor 38 which produces an output signal at circuit point 39. The base electrode of transistor 40 is cut off for a short time when the resistor 38 is at the same potential as line 37. This action resets the circuit parameters to the initial state so that the oscillations will recycle.

Figure 4:
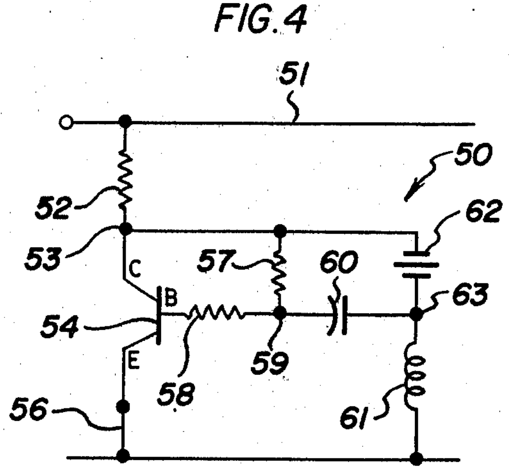
FIG. 4 is an alternate configuration of an oscillator constructed in accordance with the principles of this invention and utilizes a crystal in conjunction with the tuned circuit of the oscillator.

Referring now to FIG. 4 there is seen another alternate embodiment of an oscillator circuit constructed in accordance with the principles of this invention and is designated generally by reference numeral 50. The oscillator circuit 50 receives operating potential over a line 51 which is connected to a series resistor 52 which, in turn, has the other end thereof connected to a circuit point 53. The circuit point 53 is the output terminal point for the oscillator circuit. Also connected to circuit point 53 is the collector electrode of the transistor 54 which, in turn, has its emitter electrode connected to ground potential over a line 56. Operating bias voltage is applied to the base electrode of transistor 54 through a pair of series connected resistors 57 and 58 which are connected together at a circuit point 59 together with a coupling capacitor 60.

The operating frequency characteristics of the oscillator 50 are obtained by a fixed value inductance element 61 connected in series with a crystal 62 at a circuit point 63. In this circuit configuration, the bias voltage is delivered through a pair of resistors and the feedback voltage is also delivered through one of the resistors. The static circuit parameter characteristics are taken into consideration by the values of transistor 54 and resistors 52, 57 and 58. However, the dynamic circuit characteristics are substantially the same as those set forth with regard to FIG. 3 with the exception that a series resonant crystal 62 is utilized. Furthermore, the resistor 58 is of a value to reduce the critical tuning of inductance element 61 for proper circuit operation.

Figure 5:
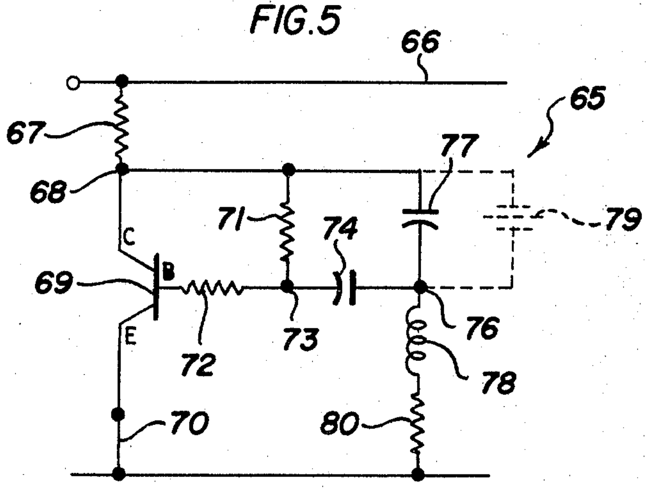
FIG. 5 is still another alternate circuit configuration of an oscillator constructed in accordance with the principles of this invention and further includes a resistor connected in series with the tuned circuit for obtaining substantially complete sine wave output signals from the oscillator.

Referring now to FIG. 5 there is seen still another alternate configuration of an oscillator circuit constructed in accordance with the principles of this invention and is designated generally by reference numeral 65. In this circuit configuration operating voltage is applied to the oscillator over a line 66 through a series resistor 67 which has one end thereof connected to a circuit point 68 together with the collector electrode of a transistor 69. Tge base electrode of transistor 69 is connected to ground potential over a line 70. Operating bias potential is applied to the base electrode of transistor 69 through a pair of series connected resistors 71 and 72 which are connected at a circuit point 73 together with a coupling capacitor 74. Coupling capacitor 74 has the other end thereof connected to a circuit point 76 intermediate the resonant capacitance element 77 and the series connected inductance element 78. In the illustrated embodiment it will be noted that the crystal 79 may be incorporated, as illustrated in phantom lines, in place of capacitor 77.

The circuit configuration illustrated in FIG. 5 provides a substantially nondistorted sine wave output configuration as the result of using a series connected resistor element 80. The resistance element 80 is connected in series with the inductance and capacitance forming the resonant circuit. With resistor 80 connected in series with the resonant circuit, the output sine wave signal has minimum distortion and the oscillator circuit can operate as a free running oscillator with either the capacitor 77 or a crystal 79.

Figure 6:
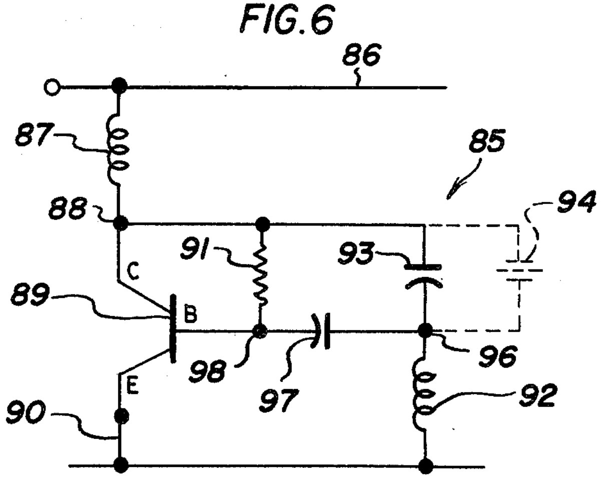
FIG. 6 is still another alternate circuit configuration of an oscillator constructed in accordance with the principles of this invention and utilizes an inductance element connected to the load terminal of the transistor.

Referring now to FIG. 6 there is seen yet another alternate embodiment of an oscillator circuit constructed in accordance with the principles of this invention and designated generally by reference numeral 85. Operating voltage is applied to the oscillator circuit over a line 86. However, in this circuit configuration the load impedance applied to the oscillator is through an inductance element 87 which has one end thereof connected to an output circuit point 88 of the oscillator circuit. Circuit point 88 is coupled to the collector electrode of a transistor 89 which, in turn, has its emitter electrode connected to ground potential over a line 90. Operating bias is applied to the base electrode of transistor 89 through a resistor element 91. The resonant tuned circuit once again comprises an inductance element 92 connected in series with a capactior 93 or with a crystal 94 here illustrated in phantom lines.

The circuit point 96 connected between inductor 92 and capacitor 93 has connected thereto one end of a coupling capacitor 97 which has the other end thereof connected to a circuit point 98 together with the base electrode and resistor 91. The circuit operation of oscillator 85 is substantially the same as that set forth hereinabove with regard to the other circuit configurations, with all of the advantages still being maintained, except that the load resistor is replaced with the inductance element 87. This circuit configuration provides a peak-to-peak output amplitude signal at terminal 88 which is greater than the amplitude of the supply voltage applied to line 86. Furthermore, the circuit 85 operates over a wide voltage range with the power output obtained at circuit point 88 substantially equal to the power input from the line 86. Therefore, the efficiency of the oscillator circuit 85 is substantially unity. Furthermore, it will be noted that the circuit configurations illustrated herein require essentially only six basic electronic elements to provide an oscillator circuit of reliable and efficient operating characteristics. Furthermore, good isolation characteristics are obtained between the output terminal 88 and the inductance capacitance elements of the resonant circuit.

Figure 7:
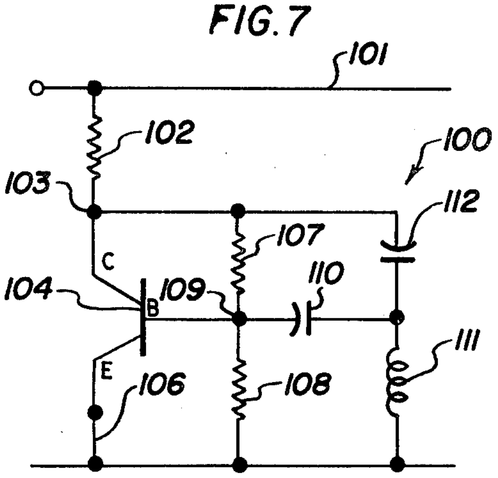
FIG. 7 illustrates another alternate embodiment of the oscillator circuit constructed in accordance with this invention and illustrates a voltage-dropping resistor network for applying base bias to the transistor oscillator.

Referring now to FIG. 7 there is seen still another alternate circuit configuration of the oscillator circuit constructed in accordance with the principles of this invention and is designated generally by reference numeral 100. The oscillator circuit 100 receives operating voltage over a line 101 through a series load resistor 102 which has the other end thereof connected to the oscillator output terminal 103. The oscillator output terminal 103 is connected to the collector electrode of a transistor 104 which, in turn, has the emitter electrode thereof connected to ground potential over a line 106. In this circuit configuration operating bias is applied to the base electrode of transistor 104 through a shunt bias resistor configuration comprising a pair of resistor elements 107 and 108 which have a circuit point 109 located therebetween connected to the base electrode of transistor 104. Also connected to circuit point 109 is one end of the feedback coupling capacitor 110. The oscillator circuit has series connected inductance element 111 and capacitance element 112 which constitute the major inductive reactance and capacitive reactance components of the circuit for oscillation. The oscillator 100 is temperature compensated to stabilize the operation of transistor 104 by shunting the base emitter junction thereof with resistor 108.

Figure 8:
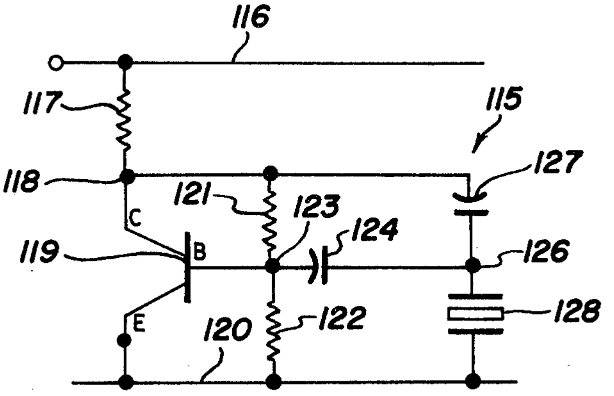
FIG. 8 is still another alternate embodiment of the oscillator circuit of this invention and utilizes a piezoelectric resonator in place of the inductance element for obtaining the necessary resonant circuit for the oscillator.

Referring now to FIG. 8 there is seen yet another alternate circuit configuration of an oscillator constructed in accordance with the principles of this invention and is designated generally by reference numeral 115. Here the oscillator circuit receives an operating voltage over a line 116 through a load resistor 117 which has the other end thereof connected to an output terminal 118 of the oscillator circuit. Also connected to the output terminal 118 is the collector electrode of a transistor 119 which, in turn, has the emitter electrode thereof connected to ground potential over a line 120. Operating bias voltage is applied to the base electrode of transistor 119 through a pair of series connected resistor elements 121 and 122. The resistor elements 121 and 122 form a circuit point 123 to which is also connected one end of a feedback coupling capacitor 124. The other end of capacitor 124 is connected to a circuit point 126 which receives one end of a capacitor element 127 and one end of a piezoelectric resonator 128. This circuit configuration also provides for temperature stabilization of the base emitter junction of transistor 119 by the use of resistor 122 while also incorporating a piezoelectric resonator in place of an inductive element. The basic advantages of this circuit configuration are substantially reduced size, as piezoelectric resonators are relatively small, and provide improved circuit stabilization.

Figure 9:
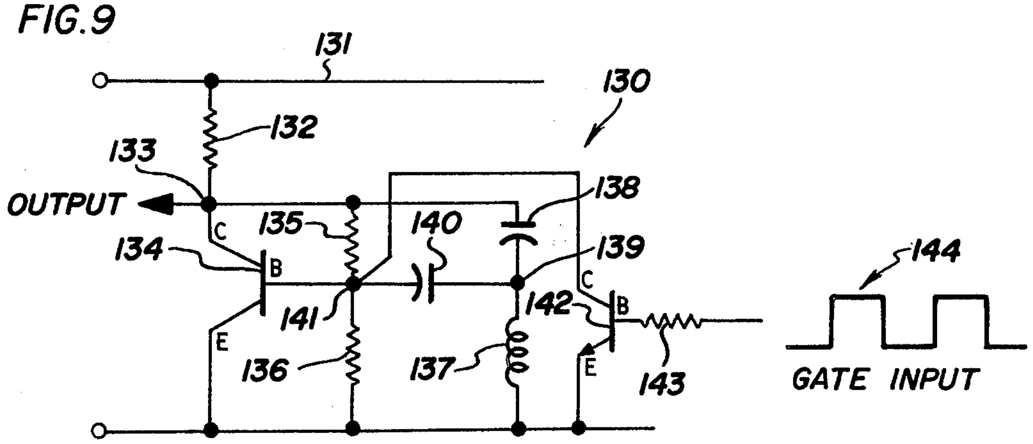
FIG. 9 illustrates a gated oscillator circuit configuration constructed in accordance with the principles of this invention and has the gate controlled transistor thereof connected directly to the base electrode of the oscillator transistor.

Referring to FIG. 9 there is seen a circuit configuration utilizing the basic oscillator circuit constructed in accordance with the principles of this invention. Here the oscillator circuit 130 is a gated output oscillator which alternately renders the oscillator circuit operative and inoperative to provide gated bursts of oscillations at the output terminal thereof. Operating power is applied to the oscillator circuit 130 over a line 131 and through a series load resistor 132 to an output terminal 133. Also connected to the output terminal 133 is the collector electrode of a transistor 134. Operating bias potential is applied to the base electrode of transistor 134 through a resistor 135 while temperature compensation of the base emitter junction of transistor 134 is obtained by the shunt resistor 136. The inductive reactance for the oscillator circuit is obtained by a fixed valued inductor element 137 connected in series with a fixed valued capacitor element 137 tied together at a circuit point 139. Also connected to circuit point 139 is one end of a capacitor 140 which has the other end thereof connected to a circuit point 141. Also connected to circuit point 141 is the collector electrode of a gated transistor 142. The transistor 142 has the base electrode thereof connected to a gated input circuit through a capacitor 143 to receive square wave gate pulses as indicated by the square wave configuration 144.

The operation of the gated oscillator circuit 130 is such that when transistor 142 is in the cut off state, oscillations occur within the oscillator and output signals are obtained at terminal 133. However, when transistor 142 is rendered conductive, it places ground potential at terminal point 141 and renders the basic oscillator circuit components inoperative.

Figure 10:
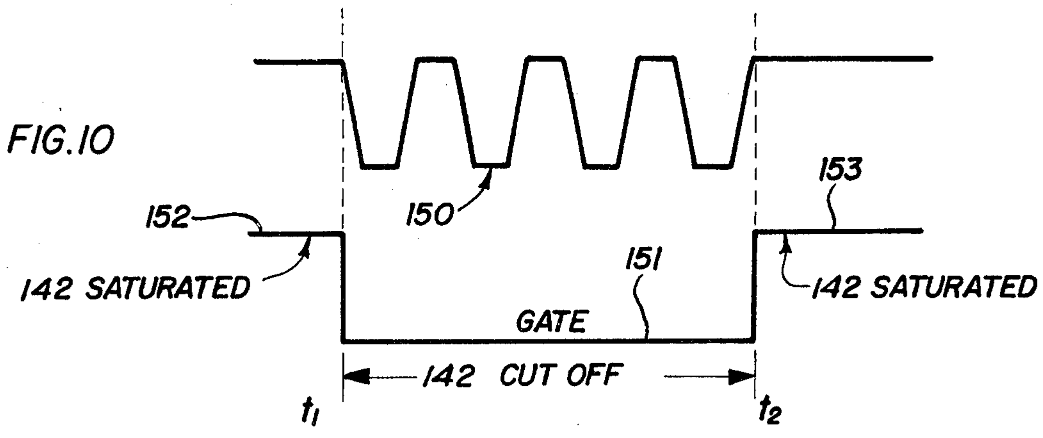
FIG. 10 illustrates the output wave shape obtained by the circuit of FIG. 9.

The operation of the gated oscillator circuit 130 is best understood when also considering the wave forms illustrated in FIG. 10. Here the basic output signal from the oscillator is illustrated by the plurality of wave alterations designated generally by reference numeral 150. As mentioned above, these signals are obtained at the output terminal 133 when transistor 142 is in the nonconductive state. This nonconductive state occurs between times $t_1$ and $t_2$ of the illustrated wave shapes. This then provides a gate pulse signal 151 as illustrated. However, before time $t_1$ and after time $t_2$ the gate pulse signals 152 and 153 render transistor 142 highly conductive. This action, therefore, disables the operation of the oscillator circuit. It will be noted that the gated transistor 142 has the collector electrode connected directly to the base electrode of transistor 134 on the oscillator circuit.

Figure 11:
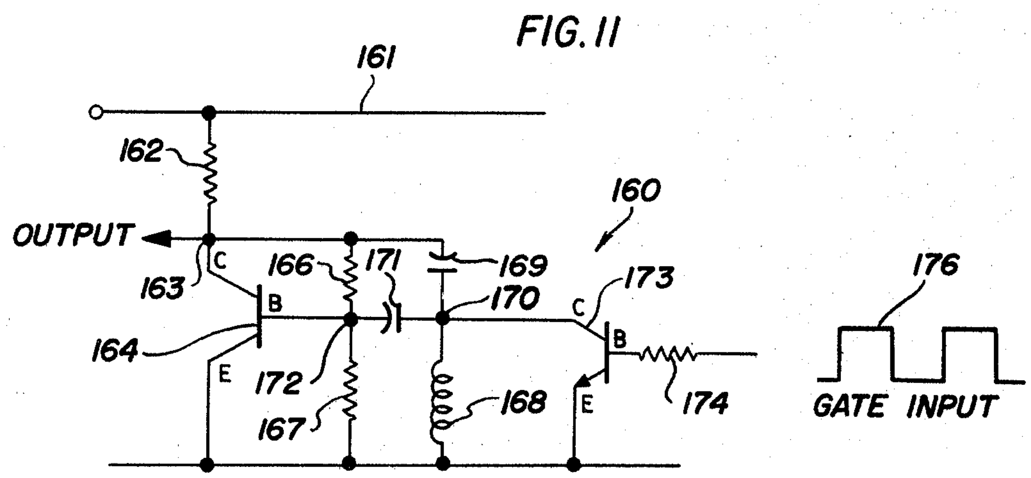
FIG. 11 illustrates still another alternate configuration of a gated oscillator circuit constructed in accordance with the principles of this invention and has the gate transistor connected to the circuit point between the inductance and capacitance elements.

Referring now to FIG. 11 an alternate configuration of a gated oscillator circuit is illustrated and designated generally by reference numeral 160. Operating voltage is applied to the oscillator circuit over a line 161 through a series load resistor 162 which has the other end thereof connected to an output circuit point 163. Also connected to the circuit point 163 is the collector electrode of a transistor 164. Operating bias is applied to the base electrode of transistor 164 through a resistor 166 while temperature compensation of the base emitter junction of transistor 164 is stabilized by use of a resistor 167. The oscillating circuit components are provided by the series connected inductance element 168 and capacitance element 169 tied together at a circuit point 170. A trigger capacitor 171 is connected between the circuit point 170 and a circuit point 172 connected to the base electrode of transistor 164.

In this circuit configuration of the gated oscillator circuit, a gating transistor 173 has the collector electrode thereof directly coupled to circuit point 170 intermediate the inductance and capacitance elements 168 and 169, respectively. Gate input signals are applied to the base electrode of transistor 173 through a resistor 174 and these gated input signals may take the configuration of the signals illustrated by reference numeral 176. The operation of the circuit is substantially the same as that of FIG. 9 in that conduction of transistor 173 will place ground potential at terminal point 170 thereby disabling operation of the tuned circuit which, in turn, disables the oscillator circuit. On the other hand, when transistor 173 is rendered nonconductive, the tuned circuit formed by the inductance and capacitance elements will resonate and the oscillator will oscillate.

Figure 12:
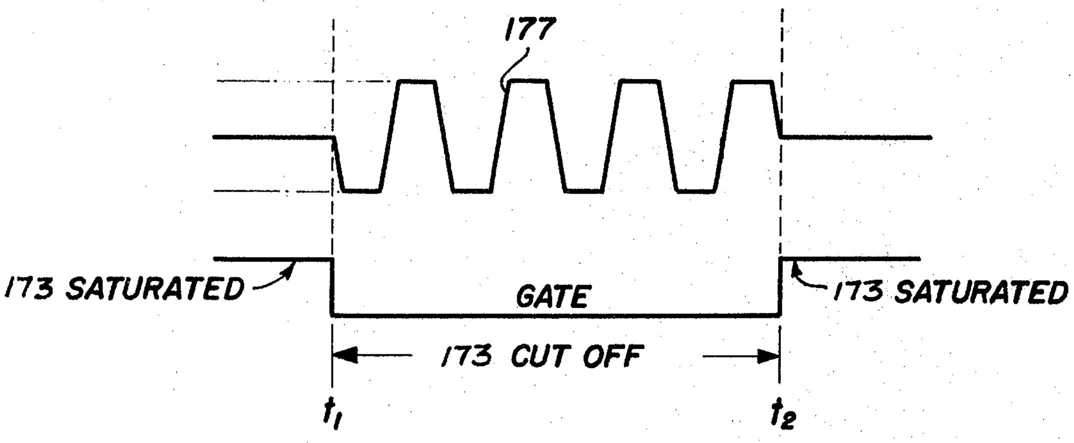
FIG. 12 illustrates the gated output signal obtained from the circuit of FIG. 11.

The output signals obtained at terminal 163 are illustrated in FIG. 12 which shows the wave configuration 177 obtained during the time interval $t_1$, $t_2$ during which transistor 173 is rendered nonconductive. However, before time $t_1$ and after time $t_2$, transistor 173 is conductive, it being preferably in the saturated state to disable the circuit. While the wave shapes shown in FIGS. 10 and 12 are somewhat squared at their end, it will be understood that a sine wave can be obtained.

Figure 13:
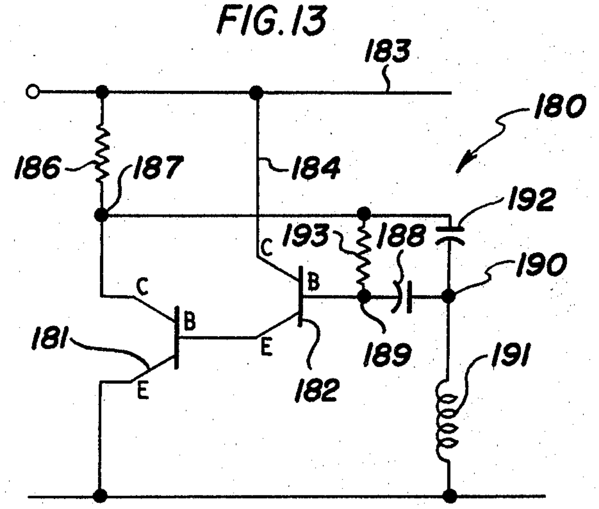
FIG. 13 illustrates a power output circuit configuration of an oscillator constructed in accordance with the principles of this invention.

Referring now to FIG. 13 there is seen yet another alternate embodiment of the present invention and designated generally by reference numeral 180. The oscillator circuit configuration 180 is here designated as a high power output oscillator which utilizes a pair of transistors 181 and 182 which may be connected together in a Darlington configuration. In the configuration illustrated in FIG. 13, the emitter electrode of transistor 182 is connected to the base electrode of transistor 181 to provide power amplification between the transistors.

Operating voltage is applied to the transistors over a line 183 with transistor 182 being directly coupled thereto over a line 184 and transistor 181 being coupled thereto through a load resistor 186. Resistor 186 is connected to an output terminal point 187 together with the collector electrode of transistor 181. A feedback signal is obtained from the oscillator circuit through a feedback coupling capacitor 188 which, in turn, has one end thereof connected to a circuit point 189 at the base electrode of transistor 182 and the other end thereof connected to a circuit point 190 between series resonating elements of the oscillator circuit. The series resonating elements comprise an inductance element 191 connected in series with a capacitor 192 substantially in the same manner as set forth hereinabove. Operating bias is applied to transistor 182 through a resistor element 193 to place transistor 182 at a predetermined conduction level. The conduction level of transistor 182 then places operating bias on transistor 181.

If the circuit configuration 180 of FIG. 13 also utilizes an inductance element in place of resistor 186, the output voltage obtained from terminal 187 will be greater than the applied voltage at line 183. In all of the embodiments disclosed herein, the transistors may be either of the NPN type or of the PNP type.

Furthermore, from the above description, it can be seen that the arrangement can be operated as a Class A oscillator by properly choosing the biasing networks. When so operated, the oscillator can produce a substantially distortion-free sinusoidal output waveform. Most, if not all, other circuit configurations operation Class A require the use of additional active devices.

While a plurality of different circuit configurations have been illustrated to show the multitude of the uses of the oscillator circuits constructed in accordance with this invention, still other circuit configurations may be envisioned without departing from the spirit and scope of the novel concepts disclosed and claimed herein.

Now that the invention has been described, what is claimed as new and desired to be secured by Letters Patent is:

1. An oscillator circuit comprising: solid state amplifier means having a common, an output and a control electrode, first circuit means coupled to a supply voltage and to said solid state amplifier means for applying operating voltage to said electrodes of said solid state amplifier means, said operating voltage being of a predetermined value, inductive reactance means, capacitive reactance means connected in series with said inductive reactance means to form a resonant circuit therewith and to form a coupling circuit point therebetween, second circuit means for connecting said inductive reactance means to said common electrode, third circuit means for connecting said capacitive reactance means to said output electrode, and a coupling capacitor connected between said coupling circuit point and said control electrode for providing feedback to sustain the oscillation of said oscillator circuit, and to effectively isolate said resonant circuit from other circuit parameters, whereby the peak-to-peak amplitude of the oscillations obtained from the oscillator circuit is substantially equal to the supply voltage and the frequency of the oscillations thereof is substantially dependent upon the value of the inductive reactance means and the capacitive reactance means forming the resonant circuit.

2. In the oscillator circuit as set forth in claim 1 wherein said inductive reactance means is an inductor element.

3. In the oscillator circuit as set forth in claim 1 wherein said inductive reactance means is a piezoelectric resonator.

4. In the oscillator circuit as set forth in claim 1 wherein said capacitive reactance means is a capacitor.

5. In the oscillator circuit as set forth in claim 1 wherein said capacitive reactance means is a crystal.

6. In the oscillator circuit as set forth in claim 1 wherein said first circuit means includes a series resistor connected between said supply voltage and one of said common and output electrodes.

7. In the oscillator circuit as set forth in claim 1 wherein said first circuit means includes a series inductor element connected to one of said common and output electrodes, whereby the peak-to-peak amplitude of the oscillations obtained from the output of said solid state amplifier means is greater than said supply voltage.

8. In the oscillator circuit as set forth in claim 1 further including a resistance element connected in series with said inductive reactance means and said capacitive reactance means to obtain substantially a sine wave configuration at the output of said solid state amplifier means.

9. In the oscillator circuit as set forth in claim 1 wherein said inductive reactance means is formed by a variable inductance element.

10. In the oscillator circuit as set forth in claim 1 wherein said capacitive reactance means is formed by a variable capacitive element.

* * * * *